United States Patent
Asamura

(10) Patent No.: US 9,136,821 B2
(45) Date of Patent: Sep. 15, 2015

(54) SURFACE MOUNT DEVICE-TYPE LOW-PROFILE OSCILLATOR

(71) Applicant: NIHON DEMPA KOGYO CO., LTD., Tokyo (JP)

(72) Inventor: Fumio Asamura, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 14/166,822

(22) Filed: Jan. 28, 2014

(65) Prior Publication Data

US 2014/0218121 A1  Aug. 7, 2014

(30) Foreign Application Priority Data

Feb. 4, 2013 (JP) ................................. 2013-019706
Sep. 24, 2013 (JP) ................................. 2013-197010
Nov. 29, 2013 (JP) ................................. 2013-247998

(51) Int. Cl.
  *H03H 9/05* (2006.01)
  *H03B 5/32* (2006.01)

(52) U.S. Cl.
  CPC ............... *H03H 9/0538* (2013.01); *H03B 5/32* (2013.01)

(58) Field of Classification Search
  CPC ........... H03H 9/0538; H03H 9/10; H03B 5/32
  USPC ...................... 331/158, 68; 310/348
  See application file for complete search history.

(56) References Cited

U.S. PATENT DOCUMENTS

2007/0247030 A1* 10/2007 Naruse ........................... 310/348
2008/0309418 A1* 12/2008 Fukunaga ....................... 331/68
2012/0319792 A1* 12/2012 Harima .......................... 331/158
2013/0187723 A1*  7/2013 Harima et al. ................. 331/158

FOREIGN PATENT DOCUMENTS

JP    2004-179734    6/2004
JP    2009-060452    3/2009
JP    2012-085101    4/2012

* cited by examiner

*Primary Examiner* — Joseph Chang
(74) *Attorney, Agent, or Firm* — Jianq Chyun IP Office

(57) ABSTRACT

A surface mount device-type low-profile oscillator is provided. A main surface of an IC chip unit is joined to a bottom surface where the external terminals of a crystal unit section are formed. An integrated circuit portion includes a circuit forming, together with the crystal unit of the crystal unit section, an oscillator circuit on the main surface of the IC chip unit, and IC terminals formed with a plurality of IC electrode terminals, and two connection terminals connecting the external terminals of the crystal unit section are provided. The IC electrode terminals and mounting terminals are electrically connected with electrical columns provided in via holes penetrating in the direction of thickness of a silicon plate of a bare chip. The crystal unit section and the IC chip unit are joined with an anisotropic conductive adhesive applied to the main surface of the IC chip unit.

12 Claims, 13 Drawing Sheets

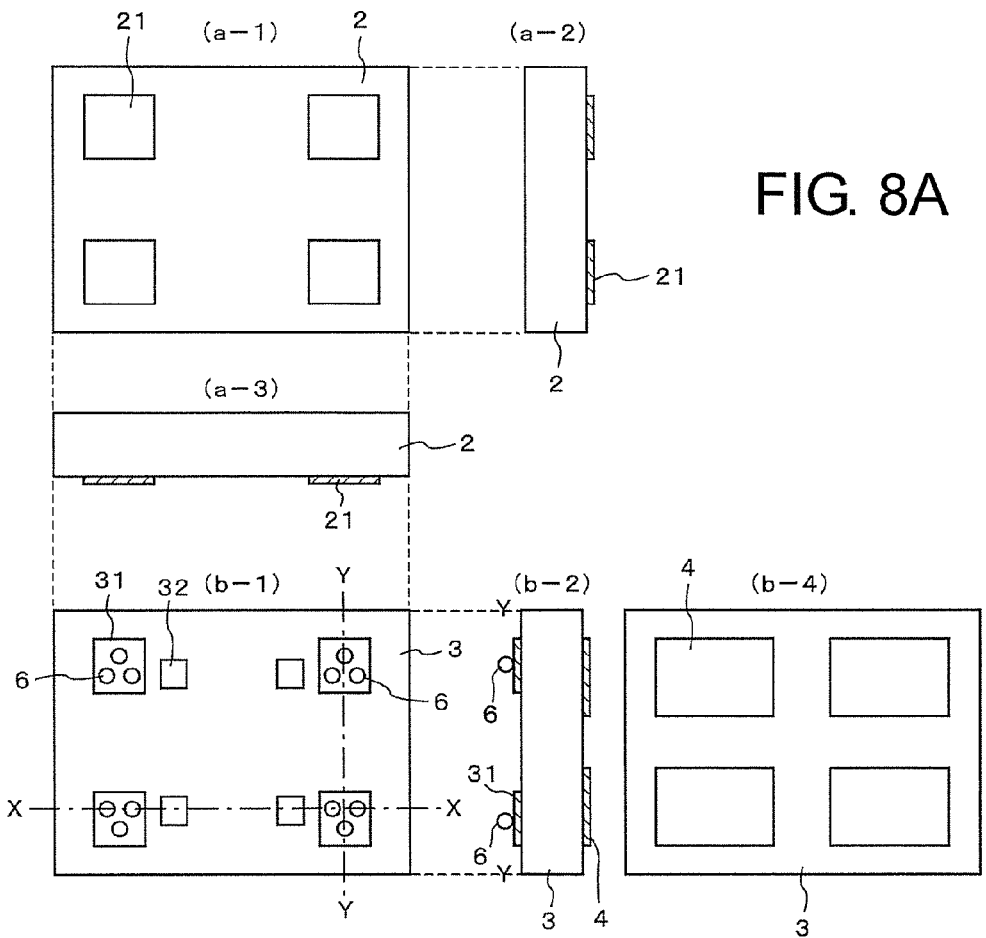
FIG. 8A
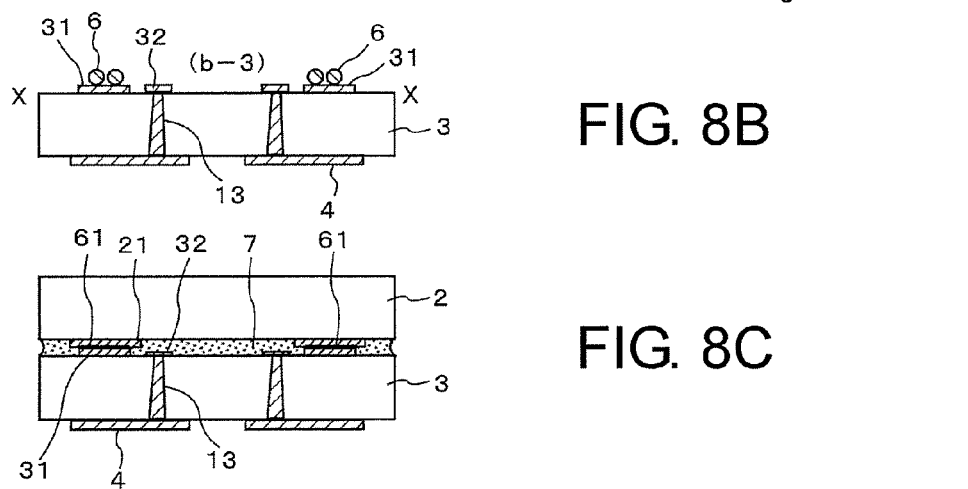
FIG. 8B
FIG. 8C

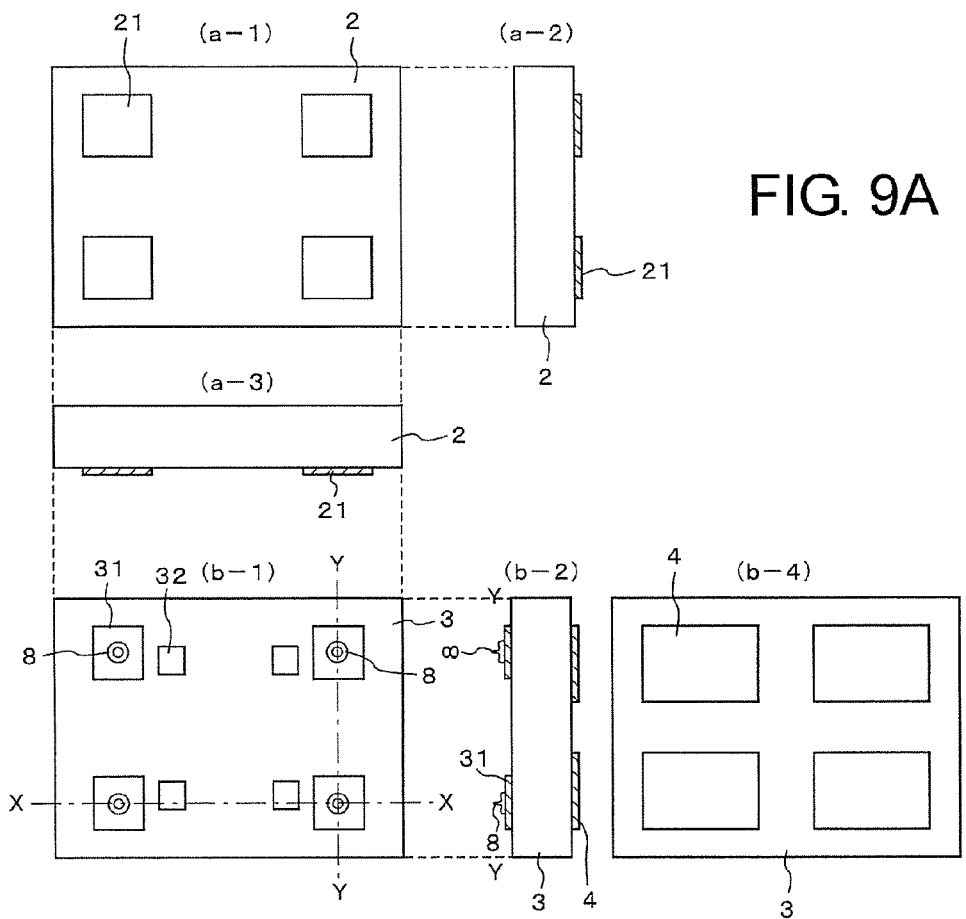
FIG. 9A
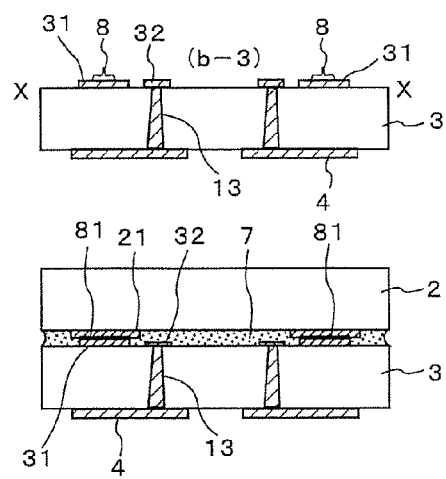
FIG. 9B
FIG. 9C

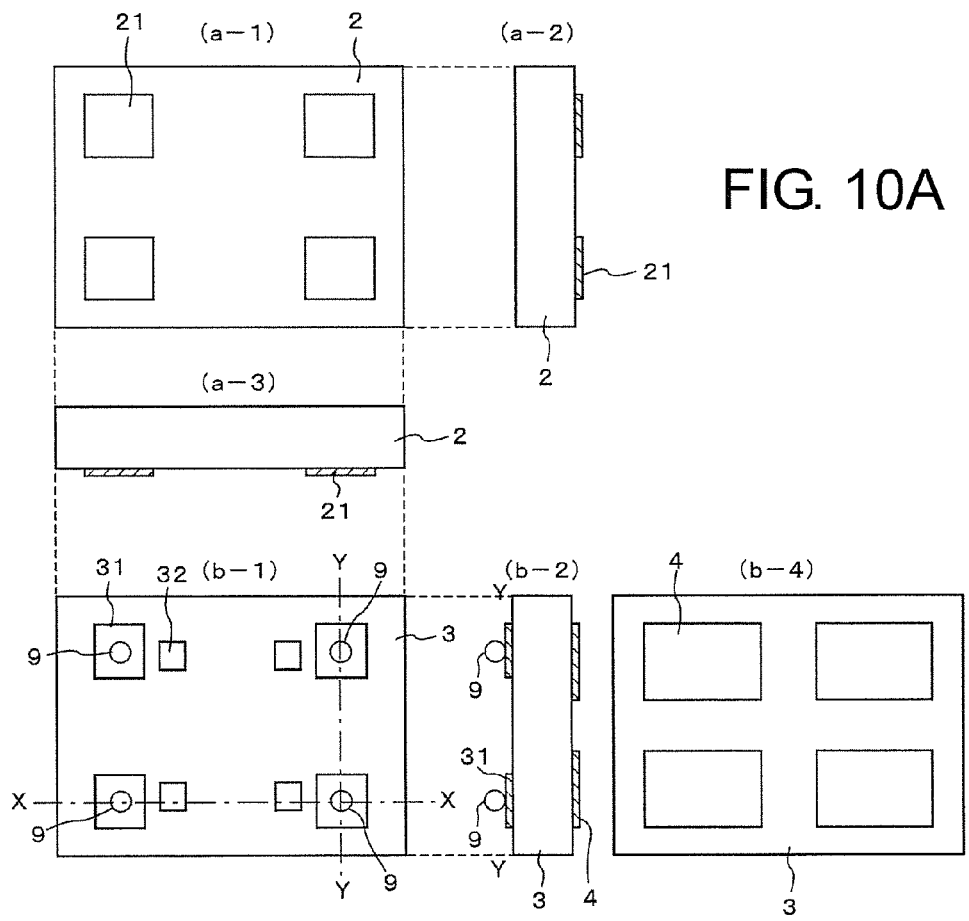
FIG. 10A
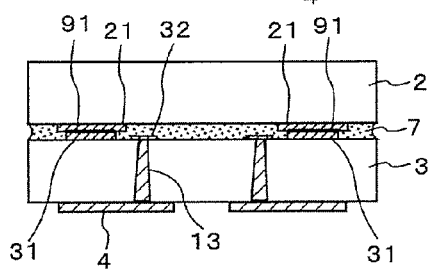
FIG. 10B
FIG. 10C

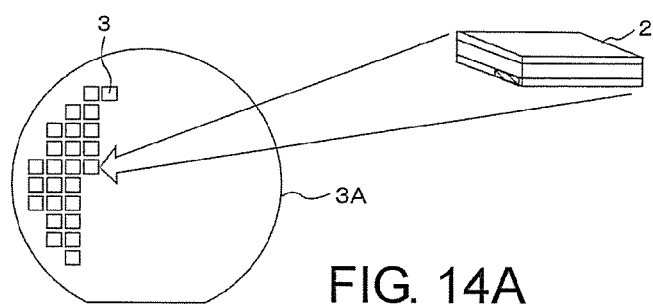
FIG. 14A
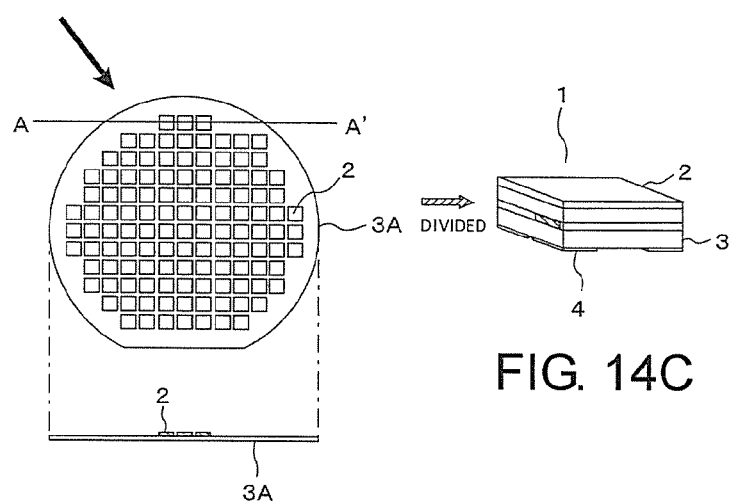
FIG. 14C
FIG. 14B

SURFACE MOUNT DEVICE-TYPE LOW-PROFILE OSCILLATOR

CROSS REFERENCE TO RELATED APPLICATIONS

This application claims the priority benefit of Japanese application serial no. 2013-019706, filed on Feb. 4, 2013, Japanese application no. 2013-197010, filed on Sep. 24, 2013, and Japanese application no. 2013-247998, filed on Nov. 29, 2013. The entirety of each of the above-mentioned patent applications is hereby incorporated by reference herein and made a part of specification.

TECHNICAL FIELD

The present invention relates to an oscillator, and more particularly to a surface mount device-type low-profile oscillator in which a crystal unit section and an IC chip unit forming an oscillator circuit together with such a crystal unit section are integrally formed to achieve a low profile and a small size.

DESCRIPTION OF THE RELATED ART

Since a surface mount device-type oscillator is small and lightweight, it is built in as a reference source of a frequency and time in portable electronic equipment where a typical example of which is a high-performance mobile telephone (so-called smartphone). The oscillator described above is comprised of a crystal unit section holding a crystal unit or a resonator (hereinafter referred to as a crystal unit) and an IC chip. In the IC chip, an oscillator circuit portion forming an oscillator circuit, a buffer circuit portion and the like are integrated together with the crystal unit. Depending on the type of oscillator, a temperature compensation circuit or a temperature control circuit and a circuit or a mechanism, such as a constant temperature mechanism, necessary to enhance the function of the oscillator are integrated thereinto. Then, an oscillation portion and the IC chip are installed in a common package as a single electronic component.

In an IC chip, a chip (hereinafter referred to an IC bare chip or simply referred to as a bare chip) sliced out from a wafer is directly connected as a single unit to a crystal unit section, thus the reduction in the size and profile of an oscillator is enhanced. As a common method of mounting an IC bare chip, flip-chip mounting (FCB) is known. In the flip-chip mounting, a plurality of bumps (terminals, IC terminals) provided on the integrated circuit portion formation surface of a silicon substrate of the IC bare chip are arranged opposite to a plurality of substrate electrodes provided in the corresponding positions of a circuit substrate and are made to face downward, and are connected collectively with solder or the like. Then, in general, an underfill resin is made to flow in between the mounted bare chip and the circuit substrate, thus the mechanical strength of the oscillator is acquired.

As a mounting technology related to the mounting technology of the IC bare chip in the technical field of the oscillator according to the present invention, for example, there is a mounting technology used in a crystal oscillator that is disclosed in patent document 1 (see Japanese Laid-Open Patent Publication No. 2012-85101). In the crystal oscillator utilized in this mounting technology, an external terminal provided on the bottom side wall of a crystal unit is connected integrally to a connection terminal (IC terminal) provided around the periphery of the integrated circuit portion surface of a silicon substrate of the IC bare chip. With respect to a mounting terminal for mounting on a circuit substrate or the like, a notch (castellation) is provided in the side surface of the silicon substrate, and with an electrode (side surface electrode) formed in this notch, an electrode pad provided on the integrated circuit surface of the silicon substrate and the mounting terminal provided in the bottom surface (i.e. the opposite surface to the crystal unit section) are connected.

In a piezoelectric device disclosed in patent document 2 (Japanese Laid-Open Patent Publication No. 2009-60452), a reverse mesa crystal unit section formed by etching processing from a crystal substrate and an IC chip are arranged on the back surface of the reverse mesa crystal unit section. An external terminal provided in the bottom surface of the substrate portion of the crystal unit section and a side surface electrode provided in the side wall of the IC chip are connected with a conductive junction material provided in the side wall of the crystal unit section, thus electrical connection and mechanical junction are performed on both the components.

A mounting technology in which an IC terminal provided in the integrated circuit formation surface of a silicon substrate and a mounting terminal provided in the back surface (i.e. the opposite surface to the integrated circuit formation surface) of the silicon substrate are connected through an electrode column embedded in a via hole formed in the periphery of the silicon substrate is disclosed in patent document 3 (see Japanese Laid-Open Patent Publication No. 2004-179734).

SUMMARY

In some of the conventional technologies, a plurality of through holes (penetration holes) forming electrical conductive portions for electrically connecting a crystal unit or a crystal unit section (such as a crystal unit) and an IC terminal provided in the main surface (the integrated circuit formation surface) of an IC chip or an IC bare chip are provided in the boundaries of the individual IC pieces of a silicon substrate, and divided into the individual pieces is performed along lines passing through the centers of the through holes. For such dividing processing, an extremely accurate dicing operation is required. When the electrical conductive portions between the crystal unit or the like and the IC bare chip or the like are connected with through electrodes provided around the silicon substrate to achieve a low profile, since the silicon substrate is divided at the center of the through electrodes, a highly accurate operation is required.

Moreover, in some of the conventional technologies, the silicon substrate of an IC bare chip and a glass cover form a space for holding a crystal unit, and the connection of the external terminal of the crystal unit and the crystal connection terminal of the silicon substrate and the connection of the IC terminal of an integrated circuit provided in an IC chip and a mounting terminal are performed with connection electrodes formed in via holes provided in the silicon substrate. However, in such technologies, the via holes are likely to degrade the rigidity of a container.

Furthermore, in a technology in which, when an IC chip or an IC bare chip having an oscillator circuit and the like integrated in a crystal unit section of crystal and the like is joined, connection electrodes or the like are provided in their side walls, even if a low profile is achieved, the mounting occupation area (foot print) thereof is increased.

Thus, a need exists for providing a surface mount device-type low-profile and low-mounting occupation area oscillator in which a crystal unit section and an IC bare chip (IC chip unit) are overlaid on each other and are joined, in which a low profile and a high rigidity are acquired without any increase in the mounting occupation area. The oscillator mentioned herein is not limited to a simple oscillator but includes electronic components in a broad sense, such as oscillators (TCXO, OCXO and the like) having a temperature compensation circuit, a temperature control mechanism or the like or resonator, and oscillators utilizing a crystal unit which utilizes mechanical vibration such as a component made by MEMS to output a predetermined frequency.

To satisfy the above need, the present invention has the following means. Specifically, according to an aspect of the present invention, there is provided a surface mount device-type low-profile oscillator in which a crystal unit section and an IC chip unit are integral. The crystal unit section hermetically seals a crystal unit therein, and includes, on an external surface, an insulation container provided with an external terminal for acquiring an oscillation output of the crystal unit. The IC chip unit is a bare chip, and includes, on a surface of the IC chip unit facing to the external terminal provided in the crystal unit section of the bare chip, an integrated circuit portion that forms an oscillator circuit together with the crystal unit and a crystal unit connection terminal connected to the external terminal of the crystal unit section. The external terminal between a formation surface of the external terminal provided in the insulation container of the crystal unit section and the surface of the IC chip unit facing to the external terminal and a part of the surface of the IC chip unit facing to the crystal unit connection terminal are connected through the crystal unit connection terminal, and an area between the external terminal and a part of the surface of the IC chip unit not facing to the crystal unit connection terminal is directly adhered with an adhesive.

According to an aspect of the present invention, in the surface mount device-type low-profile oscillator, between the formation surface of the external terminal provided in the insulation container of the crystal unit section and the one surface of the IC chip unit, an anisotropic conductive adhesive formed of a solder particle containing thermosetting resin is interposed therein. The external terminal of the crystal unit and the part of the surface of the IC chip unit facing to the crystal unit connection terminal of the IC chip unit are directly joined by melting and curing of the solder particles. The external terminal and the part of the surface of the IC chip unit not facing to the crystal unit connection terminal are directly adhered by melting and curing of the thermosetting resin.

According to an aspect of the present invention, in the surface mount device-type low-profile oscillator, the external terminal of the crystal unit section and the part of the surface of the IC chip unit facing to the crystal unit connection terminal of the IC chip unit are directly joined by melting and curing of a high temperature solder, and the external terminal and the part of the surface of the IC chip unit not facing to the crystal unit connection terminal are directly adhered by melting and curing of the thermosetting resin.

According to an aspect of the present invention, in the surface mount device-type low-profile oscillator, a gold plated pad is provided on the external terminal provided in the insulation container of the crystal unit section, and a gold stud bump on gold plating is provided in the crystal unit connection terminal of the IC chip unit. The external terminal and the part of the surface of the IC chip unit facing to the crystal unit connection terminal are joined by gold-gold flip-chip bonding (FCB) made between the gold plated pad of the external terminal and the gold stud bump. The external terminal and the part of the surface of the IC chip unit not facing to the crystal unit connection terminal are directly adhered by melting and curing of the thermosetting resin.

According to an aspect of the present invention, in the surface mount device-type low-profile oscillator, a gold plated pad is provided on the external terminal provided in the insulation container of the crystal unit section, and a solder bump obtained by placing solder on gold plating is provided in the crystal unit connection terminal of the IC chip unit. The external terminal and the part of the surface of the IC chip unit facing to the crystal unit connection terminal are joined by the gold plated pad of the external terminal and the solder bump of the crystal unit connection terminal. The external terminal and the part of the surface of the IC chip unit not facing to the crystal unit connection terminal are directly adhered by melting and curing of the thermosetting resin.

According to an aspect of the present invention, in the surface mount device-type low-profile oscillator, the insulation container of the crystal unit section is formed with a bottom plate, a lid plate and a crystal unit formation plate sandwiched between the bottom plate and the lid plate after formation of the crystal unit. The external terminal is provided on a bottom surface that is an opposite surface of the bottom plate to the crystal unit formation plate.

According to an aspect of the present invention, in the surface mount device-type low-profile oscillator, the bottom plate, the lid plate and the crystal unit formation plate of the hermetically sealed insulation container are formed with a blank. The crystal unit formed on the crystal unit formation plate is a reverse mesa type obtained by processing the blank.

According to an aspect of the present invention, in the surface mount device-type low-profile oscillator, the crystal unit section is formed with the insulation container of ceramic, the crystal unit held within a concave portion provided in the insulation container and a plate-shaped metallic lid plate that hermetically seals the concave portion. The external terminal is provided on a bottom surface that is an opposite surface of the main body container to the metallic cover.

According to an aspect of the present invention, in the surface mount device-type low-profile oscillator, the crystal unit section is formed with a bottom plate of glass, a crystal unit formation plate obtained by processing a crystal unit part to form a reverse mesa type and a glass lid plate that is a glass plate which seals the crystal unit formed on the crystal unit formation plate together with the bottom plate. The external terminal is provided on a bottom surface that is an opposite surface of the bottom plate to the glass lid plate.

According to an aspect of the present invention, in the surface mount device-type low-profile oscillator, the crystal unit section is formed with a bottom plate of silicon, a crystal unit formation plate obtained by processing a crystal unit part to form a reverse mesa type and a silicon lid plate that is a silicon plate which seals the crystal unit formed on the crystal unit formation plate together with the bottom plate. The external terminal is provided on a bottom surface that is an opposite surface of the main body container to the silicon lid plate.

According to an aspect of the present invention, in the surface mount device-type low-profile oscillator, an integrated circuit portion forming the oscillator circuit of the IC chip unit includes a temperature compensation circuit, a temperature control circuit or a constant temperature mechanism.

According to an aspect of the present invention, in the surface mount device-type low-profile oscillator, the amount of a thermosetting resin provided between the crystal unit section and the IC chip unit is enough to fill a gap with the IC chip unit at a time of joining to the IC chip unit.

According to an aspect of the present invention, the crystal unit section holds the crystal unit within the hermetically sealed insulation container, and has, on the bottom surface of the hermetically sealed insulation container, at least two external terminals for connecting an oscillation output of the crystal unit to the IC chip unit. As the external terminals, four or more terminals including a dummy terminal for providing a balance of joining with the IC chip unit are provided.

According to an aspect of the present invention, as described above, the IC chip unit is a bare chip cut from a semiconductor wafer that has been subjected to integration processing.

According to an aspect of the present invention, on the main surface of the IC chip unit opposite to the bottom surface of the crystal unit section, the integrated circuit portion that integrates an oscillator configuration circuit including the oscillator circuit together with the crystal unit and the IC terminals formed with a plurality of IC electrode terminals and at least two crystal connection terminals connected to the external terminals of the crystal unit section are provided.

According to an aspect of the present invention, on the opposite surface of the IC chip unit to the crystal unit section, a plurality of mounting teiininals for mounting on an applicable device are provided.

According to an aspect of the present invention, the terminals (IC electrode terminals) connected to the mounting terminals among a plurality of IC terminals in the IC chip unit are connected through the electrode columns provided in the via holes penetrating in the direction of thickness of a semiconductor substrate.

According to an aspect of the present invention, the bottom surface of the hermitically sealed insulation container of the crystal unit section and the terminal foimation surface (main surface) of the IC chip unit are joined with the anisotropic conductive adhesive formed of a thermosetting resin containing solder particles (solder containing thermosetting resin).

According to an aspect of the present invention, the external terminals and the IC electrode terminals connected to the mounting terminals among the IC terminals are electrically connected by melting and curing of the solder particles of the anisotropic conductive adhesive.

According to an aspect of the present invention, the external terminals provided on the bottom surface of the hermetically sealed insulation container of the crystal unit section and the IC connection terminals provided on the terminal formation surface of the IC chip unit are joined with a high temperature solder. It is possible to fill, with an adhesive of thermosetting resin, the gap fowled between the bottom surface of the hermetically sealed insulation container of the crystal unit section and the terminal formation surface of the IC chip unit.

According to an aspect of the present invention, the gold plated pad on the external terminal provided on the bottom surface of the hermetically sealed insulation container of the crystal unit section and the stud bump formed on the gold plating formed on the IC connection terminal provided on the connection terminal formation surface of the IC chip unit are joined by gold-gold FCB connection. With the adhesive of thermosetting resin, the gap formed between the bottom surface of the hermetically sealed insulation container of the crystal unit section and the terminal formation surface of the IC chip unit is filled.

According to an aspect of the present invention, the external terminal provided on the bottom surface of the hermetically sealed insulation container of the crystal unit section and the IC connection terminal provided on the terminal formation surface of the IC chip unit are joined by solder bumps formed on the gold pad on the external terminal and the gold plating on the IC connection terminal provided on the terminal formation surface of the IC chip unit. With the adhesive of thermosetting resin, the gap formed between the bottom surface of the hermetically sealed insulation container of the crystal unit section and the terminal formation surface of the IC chip unit is filled.

According to an aspect of the present invention, on the entire surface except for the upper surface of the external terminal provided on the bottom surface of the hermetically sealed insulation container of the crystal unit section, an insulation film can be formed to have such a thickness that at the time of joining to the IC chip unit, a sufficient amount filling the gap with the IC chip unit is provided.

According to an aspect of the present invention, the hermetically sealed insulation container of the crystal unit section is formed with a bottom plate, a lid plate and a crystal unit formation plate sandwiched between the bottom plate and the lid plate, and the external terminal can be provided on a bottom surface that is an opposite surface of the bottom plate to the crystal unit formation plate.

According to an aspect of the present invention, the bottom plate and the lid plate are formed with a blank, and the crystal unit formed on the crystal unit formation plate can be a reverse mesa type obtained by processing the blank.

According to an aspect of the present invention, the crystal unit section is formed with the main body container of ceramic, the crystal unit held within a concave portion provided in the main body container and a metallic plate cover that hermetically seals the concave portion. The external terminal can be provided on a bottom surface that is an opposite surface of the main body container to the metallic plate cover.

According to an aspect of the present invention, the crystal unit section is formed with the main body container of glass, the crystal unit held in the concave portion provided in the main body container and a cover of glass hermetically sealing the concave portion. The external terminal can be provided on a bottom surface that is an opposite surface of the main body container to the cover of the glass.

According to an aspect of the present invention, the crystal unit section is formed with the main body container formed of silicon, the crystal unit held within a concave portion provided in the main body container and a cover formed of silicon hermetically sealing the portion. The external terminal can be provided on a bottom surface that is an opposite surface of the main body container to the cover formed of silicon.

According to an aspect of the present invention, the IC chip unit can include a temperature compensation circuit, a temperature control circuit or a constant temperature mechanism.

According to an aspect of the present invention, the crystal unit can be any one of a crystal unit, a crystal unit formed of piezoelectric material other than crystal, a comb-shaped electrode (IDT) and a component formed by a micro-electro-mechanical system (MEMS).

According to an aspect of the present invention, although it is necessary to provide at least two external terminals of the crystal unit section so that an oscillation signal output is connected to the IC chip unit, when the crystal unit section includes a cover formed of conductive material, the cover is used as the external terminal for connecting a ground potential, and one more external terminal can be provided.

According to an aspect of the present invention, in the case of a 2-port resonator formed with the IDT, two more external terminals are provided. In the case of a silicon MEMS resonator, in addition to the external terminal for the oscillation signal output, as a bias terminal or a third external terminal, one more external terminal is provided. The connection terminals for the IC chip unit are also provided according to the number of external terminals of the crystal unit section and the arrangement thereof.

In the following descriptions, for simplifying description of this disclosure in the present application, the number of external terminals of the crystal unit section is assumed to be two as shown in drawings such as FIGS. 2A-2B and 3A-3C.

Needless to say, in this disclosure, various variations are possible without departing from the technical aspect of the disclosure in the scope of claims in the present application.

According to the surface mount device-type low-profile oscillator configured as described above, it is possible to provide with a surface mount device-type low-profile oscillator that maintains a low profile and a high rigidity without any increase in its mounting occupation area.

BRIEF DESCRIPTION OF THE DRAWINGS

FIGS. 8A-8C are diagrams illustrating an IC chip unit applied to a sixth embodiment of the surface mount device-type low-profile oscillator disclosed herein.

FIGS. 9A-9C are diagrams illustrating an IC chip unit applied to a seventh embodiment of the surface mount device-type low-profile oscillator disclosed herein.

FIGS. 10A-10C are diagrams illustrating an IC chip unit applied to an eighth embodiment of the surface mount device-type low-profile oscillator disclosed herein.

FIGS. 14A-14C are schematic diagrams illustrating, in the illustration of a method for mounting the individually divided crystal unit section in a state of a wafer before being divided into an IC bare chip and thereafter stacking and joining the crystal unit section and the IC chip unit dividing the wafer, the former process.

DETAILED DESCRIPTION

Embodiments disclosed here will be described below with reference to the attached drawings.

[First Embodiment]

Figure 1A:
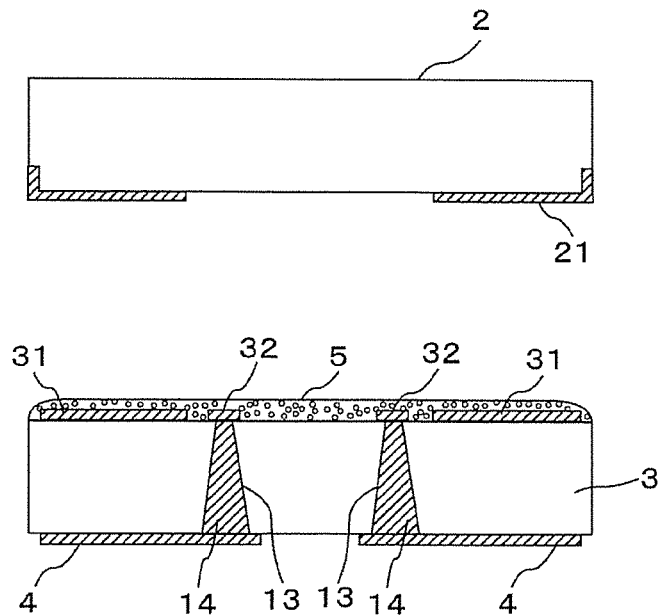
FIGS. 1A-1B are diagrams illustrating a first embodiment of a surface mount device-type low-profile oscillator disclosed herein.
Figure 1B:
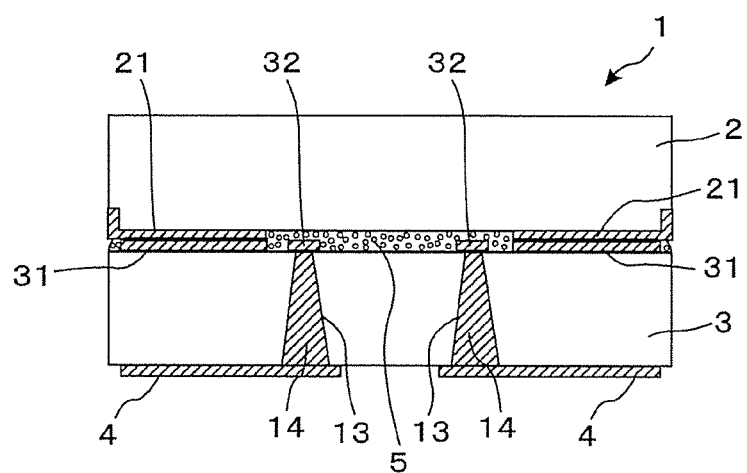
Figure 2A:
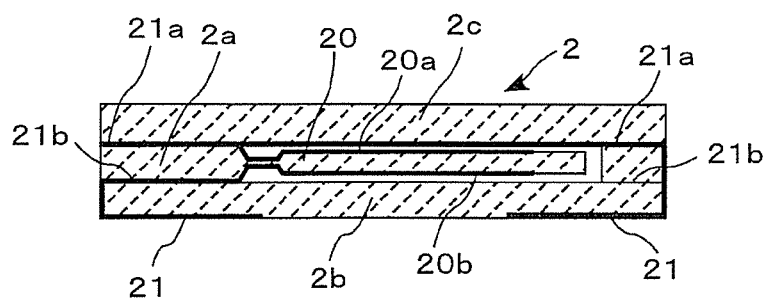
FIGS. 2A-2B are diagrams illustrating a crystal unit section applied to the first embodiment of the surface mount device-type low-profile oscillator disclosed herein.
Figure 2B:
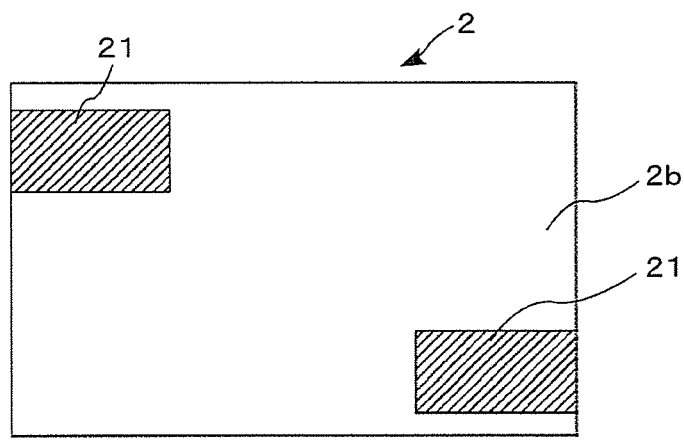
Figure 3A:
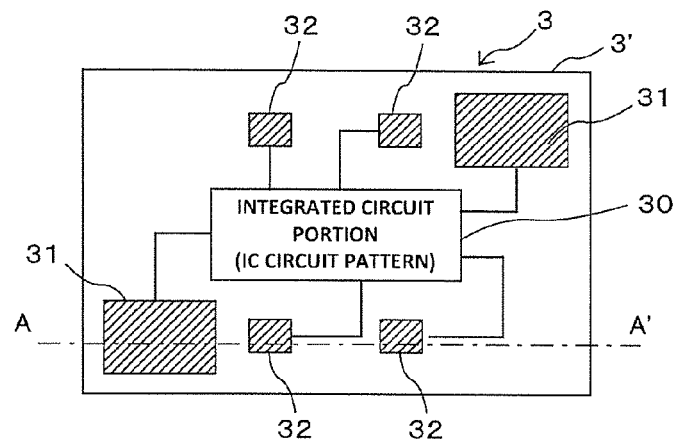
FIGS. 3A-3C are diagrams illustrating an IC chip unit applied to the first embodiment of the surface mount device-type low-profile oscillator disclosed herein.
Figure 3B:
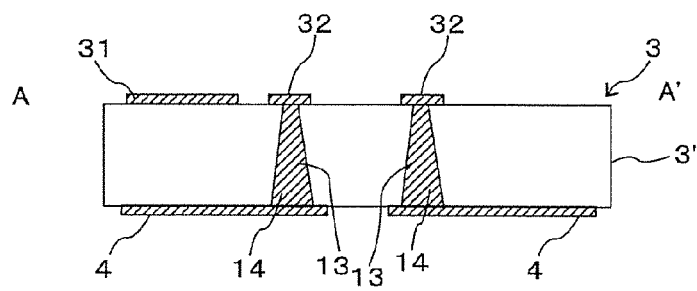
Figure 3C:
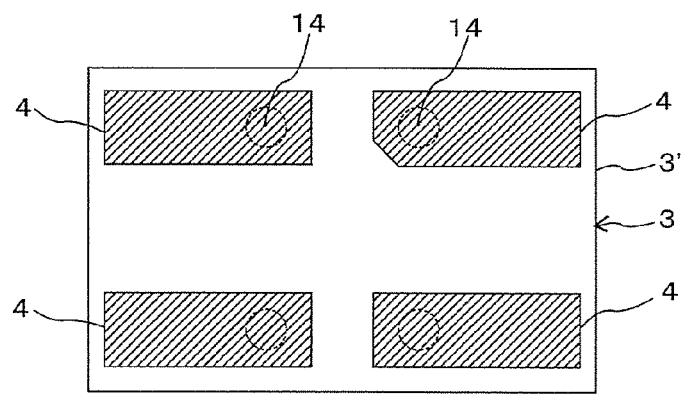

FIGS. 1A-1B are diagrams illustrating a first embodiment of a surface mount device-type low-profile oscillator disclosed here. FIG. 1A is a diagram showing a state before a crystal unit section and an IC chip unit are joined, and FIG. 1B shows a state after the joining. In the first embodiment, as the crystal unit section 2, a reverse mesa crystal unit in which a container main body and a crystal unit are all configured with a crystal unit formation plate (also simply referred to as a blank) is used. The IC chip unit 3 is an IC bare chip. FIGS. 2A-2B is the crystal unit of FIGS. 1A-1B, and are diagrams illustrating the crystal unit section formed with the reverse mesa crystal unit. FIGS. 3A-3B are diagrams illustrating the IC chip unit of FIGS. 1 1A-1B; FIG. 3A is a plan view of the IC chip unit 3 on the side of the crystal unit section, FIG. 3B is a sectional drawing taken along line A-A' of FIG. 3A, and FIG. 3C is a plan view of the IC chip unit 3 on the side of a mounting terminal.

The first embodiment of the surface mount device-type low-profile oscillator disclosed here will be described with reference to FIGS. 1A-1B, 2A-2B and 3A-3C. The surface mount device-type low-profile oscillator of the present embodiment (hereinafter also simply referred to as an oscillator) symbol 2 of FIG. 1A is a crystal unit section, and the crystal unit 20 of this crystal unit section has, as shown in FIG. 2A, a reverse mesa oscillation portion formed by etching processing on the blank, and has a crystal frame surrounding thereof. The crystal frame of the crystal unit 2a is sandwiched between the bottom plate 2b of the blank and lid plate 2c of the blank, and thus the container main body is formed. In other words, this crystal unit section 2 is an all crystal type. The IC chip unit 3 is a bare chip that will be described with reference to FIGS. 3A-3C.

As shown in FIG. 1A, the main surface that is an integrated circuit portion formation surface of the IC chip unit 3 is joined to the bottom surface where the external terminals 21 of the crystal unit section 2 are formed. The joined state is shown in FIG. 1B. The IC chip unit 3, which is a bare chip, includes, on its main surface, an integrated circuit portion (IC circuit pattern) where an oscillator configuration circuit including a circuit forming an oscillator circuit together with the crystal unit of the crystal unit section 2 is integrated and IC terminals formed with a plurality of IC electrode terminals 32 and two crystal connection terminals 31 connected to the external terminals 21 of the crystal unit section 2.

On the back surface (i.e. the opposite surface to the main surface, the mounting surface) of the IC chip unit 3, a plurality of mounting terminals 4 are provided. The IC electrode terminals 32 on the main surface and the mounting terminals 4 on the back surface are electrically connected with electrode columns (also referred to as through electrodes) 14 provided in the via holes 13 that penetrate in a direction of thickness of the silicon plate of the bare chip. The crystal unit section 2 and the IC chip unit 3 are joined together with an anisotropic conductive adhesive 5 made of thermosetting resin (i.e. solder containing thermosetting resin) such as an epoxy resin containing solder particles applied to the main surface of the IC chip unit 3 (or the back surface of the crystal unit section 2).

FIG. 1B shows a state where the crystal unit section 2 and the IC chip unit 3 are joined together with the anisotropic conductive adhesive 5. The anisotropic conductive adhesive 5 is applied between the crystal unit section 2 and the IC chip unit 3, thereafter the solder particles are melted with a heating means such as a pulse heat unit and is cured and thus the external terminals 21 of the crystal unit section 2 and the crystal connection terminals 31 of the IC chip unit 3 are connected with solder. At the same time, both the external terminal 21 and the crystal connection terminal 31 are joined by the melting and curing of the thermosetting resin (e.g. the solder containing thermosetting resin) of the anisotropic conductive adhesive 5, and the cured thermosetting resin flows into the gap between both to fill the gap, with result that a mechanical joining is achieved as a whole.

The crystal unit section 2 of the present embodiment has a structure shown in FIGS. 2A-2B. Specifically, this crystal unit section 2 is formed, as shown in FIG. 2A, with a stacked member consisting of the crystal unit 20 that is the oscillation portion (oscillation part), the base portion 2a of the crystal unit 20 and the bottom plate 2b and the lid plate 2c between which the base portion (frame) 2a of the crystal unit 20 is sandwiched. The crystal unit 20 is made by forming, through evaporation or sputtering, thin-film excitation electrodes 20a and 20b on the front and back of the oscillation part (mesa oscillation part) obtained by performing etching processing on the cantilever blank. The excitation electrodes 20a and 20b are connected to a pair of external terminals 21 provided on the side of a short side of the bottom plate with connection electrodes 21a and 21b formed between the layer between the base portion 2a and the lid plate 2c and the layer between the base portion 2a and the bottom plate 2b. As shown in FIG. 2B, the external terminals 21 are formed in one diagonal region of the bottom plate 2b of the crystal unit section 2, as a thin electrode, by surface mounting. In the other diagonal region of the bottom plate 2b, an electrode similar to the external terminals 21 is also formed as a dummy or a crystal unit inspection terminal, and thus the thickness may be made uniform.

The IC chip unit 3 is set to have a structure shown in FIGS. 3A-3C. FIGS. 3A-3C are diagrams illustrating the IC chip unit 3 of FIGS. 1A-1B. Specifically, as shown in FIG. 3A, on the main surface of the silicon plate 3' of the bare chip, the integrated circuit portion (IC circuit pattern) 30 and the IC terminals formed with the crystal connection terminals 31 and the IC electrode terminals 32. The crystal connection terminals 31 and the IC electrode terminals 32 are formed on the main surface of the silicon plate 3' in the shape of thin electrodes (see FIG. 3B). The external terminals 21 of the crystal unit section 2 and the crystal connection terminals 31 of the IC chip unit 3 are joined, as shown in FIG. 1B, with the thin solder layer obtained by the melting of the solder particles. FIG. 3C is a plan view illustrating the mounting terminals of the present embodiment and showing the bottom surface (the mounting surface) of the IC chip unit 3. In the four corners of the bottom surface, the mounting terminals 4 are provided as thin electrodes.

In the present embodiment, since all the IC electrode terminals 32 including the crystal connection terminals 31 of the IC chip unit 3 are within the gap into which the anisotropic conductive adhesive 5 is applied, the increase in the thickness by the joining of the crystal unit section 2 and the IC chip unit 3 is substantially equal to the thickness of the solder layer, which joins the external terminals 21 of the crystal unit section 2 and the crystal connection terminals 31 of the IC chip unit 3. Hence, the mounting occupation area (the projected area at the time of mounting: foot print) is equal to one of the crystal unit section 2 and the IC chip unit 3, which is larger, and a low profile is realized without any increase in the mounting occupation area. In the present embodiment, the crystal unit section 2 and the IC chip unit 3 have the same projected area, respectively.

[Second Embodiment]

Figure 4A:
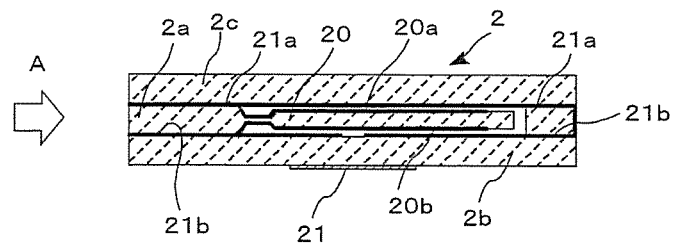
FIGS. 4A-4C are diagrams illustrating a crystal unit section applied to a second embodiment of the surface mount device-type low-profile oscillator disclosed herein.
Figure 4B:
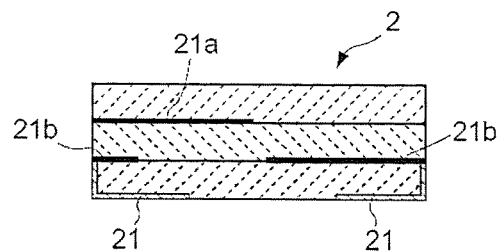
Figure 4C:
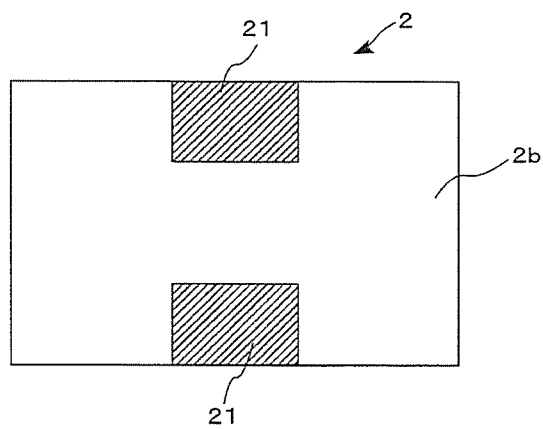

FIGS. 4A-4C are diagrams illustrating the crystal unit section of a second embodiment of the surface mount device-type low-profile oscillator disclosed here. FIG. 4A is its vertical cross-sectional view, FIG. 4B is a side view when the crystal unit section shown in FIG. 4A is seen from the direction of an arrow "A" and FIG. 4C is a plan view of a bottom plate showing the arrangement of external terminals. The present embodiment is the same as in the first embodiment in that the crystal unit section and the IC chip unit are stacked vertically but the present embodiment differs from the first embodiment in the position of the external terminals 21 of the crystal unit section 2 of the oscillator. The basic configuration of the crystal unit section 2 is formed, as in the first embodiment described with reference to FIGS. 2A-2B, with a stacked member consisting of the crystal unit 20 and the bottom plate 2b and the lid plate 2c between which the base portion 2a of the crystal unit 20 is sandwiched. As in the first embodiment, the crystal unit 20 is also made by forming, through evaporation or sputtering, the thin-film excitation electrodes 20a and 20b on the front and back of the oscillation part (mesa oscillation part) obtained by performing etching processing on the blank. The excitation electrodes are connected to a pair of external terminals 21 provided on the side of a long side of the bottom plate 2b with the connection electrodes 21a and 21b formed between the layers. On the other two sides of the bottom plate 2b or in the other diagonal region, an electrode similar to the external terminal 21 is also formed as a dummy or a crystal unit inspection terminal, and thus the thickness may be made uniform.

[Third Embodiment]

Figure 5A:
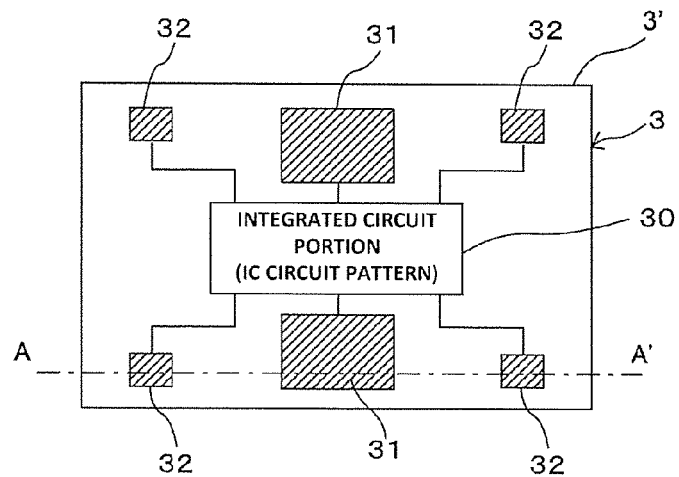
FIGS. 5A-5C are diagrams illustrating an IC chip unit applied to a third embodiment of the surface mount device-type low-profile oscillator disclosed herein.
Figure 5B:
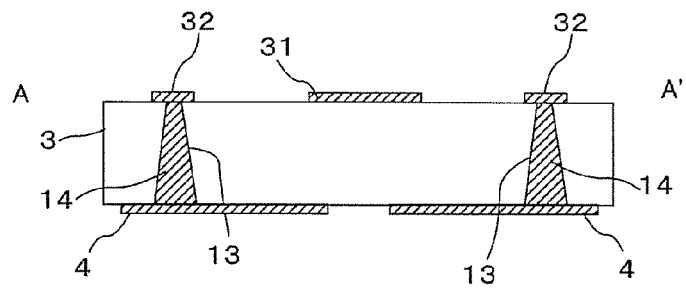
Figure 5C:
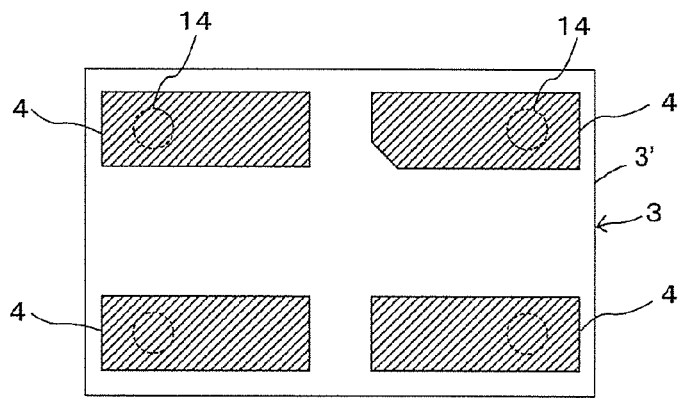

FIGS. 5A-5C are diagrams illustrating the IC chip unit of a third embodiment of the surface mount device-type low-profile oscillator disclosed here. In the IC chip unit 3, as shown in FIG. 5A, on the main surface of the silicon plate of the bare chip, the integrated circuit portion (IC circuit pattern) 30, the crystal connection terminals 31 connected to the external terminals of the crystal unit section and the IC electrode terminals 32 are formed. The crystal connection terminals 31 are arranged according to the positions of the external terminals of the crystal unit section described above. The crystal connection terminals 31 and the IC electrode terminals 32 are formed on the main surface in the shape of thin electrodes (see FIG. 5B). The external terminals 21 of the crystal unit section 2 shown in FIGS. 4A-4C and the crystal connection terminals 31 of the IC chip unit 3 are joined, as shown in FIG. 1B, with the thin solder layer obtained by the melting of the solder particles of the anisotropic conductive adhesive 5, and the cured thermosetting resin fills the gap formed between both to achieve mechanical joining FIG. 5C is a plan view illustrating the mounting terminals of the present embodiment and showing the bottom surface (the mounting surface) of the IC chip unit 3. In the four corners of the bottom surface, the mounting terminals 4 are provided as thin electrodes. The IC electrode terminals 32 and the mounting terminals 4 are connected with the electrode columns 14 provided in the via holes 13 penetrating the silicon plate 3'.

Likewise, in the present embodiment, since all the IC electrode terminals 32 including the crystal connection terminals 31 of the IC chip unit 3 are within the gap into which the anisotropic conductive adhesive 5 is applied, the increase in the thickness by the joining of the crystal unit section 2 and the IC chip unit 3 is substantially equal to the thickness of the solder layer, which joins the external terminals 21 of the crystal unit section 2 and the crystal connection terminals 31 of the IC chip unit 3. Hence, the mounting occupation area (the projected area at the time of mounting: foot print) is equal to one of the crystal unit section 2 and the IC chip unit 3, which is larger, and a low profile is realized without any increase in the mounting occupation area. Likewise, in the present embodiment, the crystal unit section 2 and the IC chip unit 3 have the same projected area.

[Fourth Embodiment]

Figure 6A:
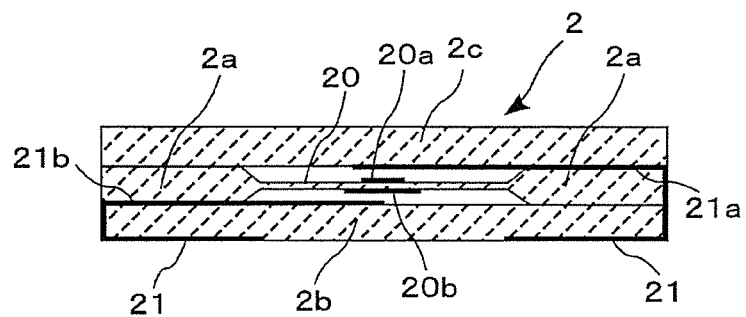
FIGS. 6A-6B are diagrams illustrating a crystal unit section applied to a fourth embodiment of the surface mount device-type low-profile oscillator disclosed herein.
Figure 6B:
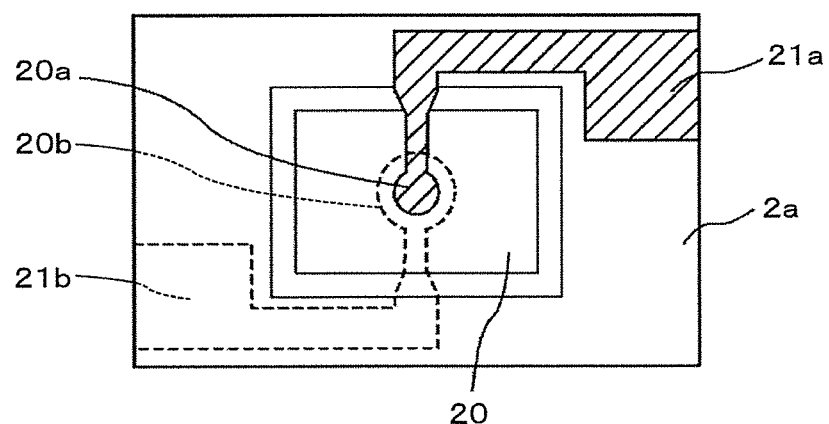

FIGS. 6A-6B are diagrams illustrating the crystal unit section of a fourth embodiment of the surface mount device-type low-profile oscillator disclosed here. The present embodiment differs from the other embodiments described above in the configuration of the oscillation portion of the crystal unit section 2 of the oscillator. The crystal unit section 2 of the present embodiment is formed, as shown in FIG. 2A, with a stacked member consisting of the crystal unit 20 that is the oscillation portion (oscillation part), the base portion 2a of the crystal unit 20 and the bottom plate 2b and the lid plate 2c between which the base portion (frame) 2a of the crystal unit 20 is sandwiched. The crystal unit 20 is made by forming, through evaporation or sputtering, the thin-film excitation electrodes 20a and 20b on the front and back of the oscillation portion (reverse mesa oscillation portion) obtained by performing etching processing on the center portion of the blank to form reverse mesa. The excitation electrodes 20a and 20b are connected to a pair of external terminals 21 (for example, see FIGS. 2A-2B) provided on the bottom plate 2b with the connection electrodes 21a and 21b formed between the layer between the base portion 2a and the lid plate 2c and the layer between the base portion 2a and the bottom plate 2b. The external terminals 21 are not limited to those shown in FIGS. 2A-2B. The joining to the IC chip unit is the same as in any of the embodiments described above.

Likewise, in the present embodiment, since all the IC electrode terminals 32 including the crystal connection terminals 31 of the IC chip unit 3 are within the gap into which the anisotropic conductive adhesive 5 is applied, the increase in the thickness by the joining of the crystal unit section 2 and the IC chip unit 3 is substantially equal to the thickness of the solder layer, which joins the external terminals 21 of the crystal unit section 2 and the crystal connection terminals 31 of the IC chip unit 3. Hence, the mounting occupation area (the projected area at the time of mounting: foot print) is equal to one of the crystal unit section 2 and the IC chip unit 3, which is larger, and a low profile is realized without any increase in the mounting occupation area. Likewise, in the present embodiment, the crystal unit section 2 and the IC chip unit 3 have the same projected area.

[Fifth Embodiment]

Figure 7A:
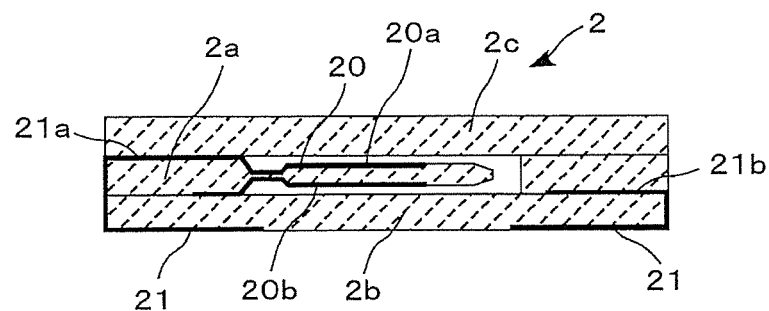
FIGS. 7A-7B are diagrams illustrating a crystal unit section applied to a fifth embodiment of the surface mount device-type low-profile oscillator disclosed herein.
Figure 7B:
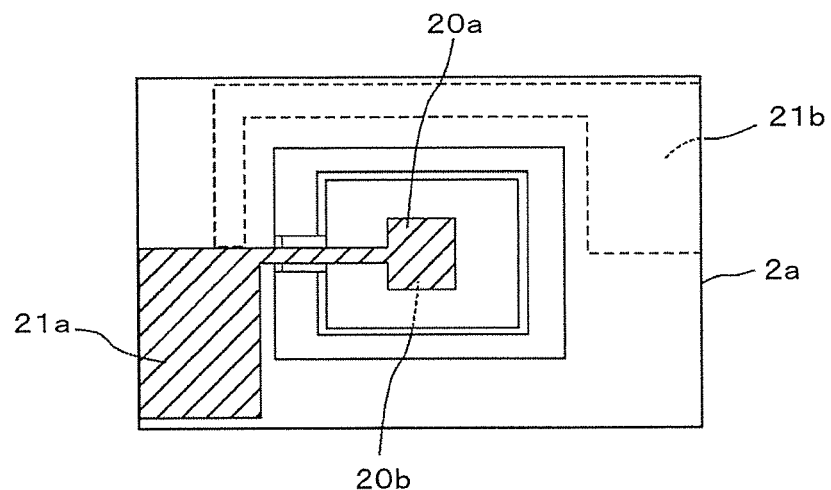

FIGS. 7A-7B are diagrams illustrating the crystal unit section of a fifth embodiment of the surface mount device-type low-profile oscillator disclosed here. The present embodiment differs from the fourth embodiment described above in the configuration of the oscillation portion of the crystal unit section 2 of the oscillator. The crystal unit section 2 of the present embodiment is formed, as shown in FIG. 7A, with a stacked member consisting of the crystal unit 20 that is the oscillation portion (oscillation part), the base portion 2a of the crystal unit 20 and the bottom plate 2b and the lid plate 2c between which the base portion (frame) 2a of the crystal unit 20 is sandwiched. The crystal unit 20 is made by forming, through evaporation or sputtering, the thin-film excitation electrodes 20a and 20b on the front and back of the cantilever oscillation portion (reverse mesa oscillation portion) obtained by performing etching processing on the blank to form reverse mesa. The excitation electrodes 20a and 20b are connected to a pair of external terminals 21 (as in the first embodiment, for example, see FIGS. 2A-2B) provided on the bottom plate 2b with the connection electrodes 21a and 21b formed between the layer between the base portion 2a and the lid plate 2c and the layer between the base portion 2a and the bottom plate 2b. The external terminals 21 are not limited to those shown in FIGS. 2A-2B. The joining to the IC chip unit is the same as in any of the embodiments described above.

Likewise, in the present embodiment, since all the IC electrode terminals 32 including the crystal connection terminals 31 of the IC chip unit 3 are within the gap into which the anisotropic conductive adhesive 5 is applied, the increase in the thickness by the joining of the crystal unit section 2 and the IC chip unit 3 is substantially equal to the thickness of the solder layer, which joins the external terminals 21 of the crystal unit section 2 and the crystal connection terminals 31 of the IC chip unit 3. Hence, the mounting occupation area (the projected area at the time of mounting: foot print) is equal to one of the crystal unit section 2 and the IC chip unit 3, which is larger, and a low profile is realized without any increase in the mounting occupation area. Likewise, in the present embodiment, the crystal unit section 2 and the IC chip unit 3 have the same projected area.

[Sixth Embodiment]

FIGS. 8A-8C are diagrams illustrating a sixth embodiment of the surface mount device-type low-profile oscillator disclosed herein. The sixth embodiment differs from the other embodiments described above in the structure of the joint of the crystal unit section 2 and the IC chip unit 3. FIG. 8A is an (a-1) bottom view, an (a-2) short-side side view and an (a-3) long-side side view of the crystal unit section. FIG. 8B is a (b-1) top view, a (b-2) short-side side view, a (b-3) long-side side view and a (b-4) bottom view of the IC chip unit. FIG. 8C is a sectional view showing a state where the crystal unit section 2 and the IC chip unit 3 are joined together. In FIGS. 8A-8C, symbol 6 represents a high temperature solder such as a Sn—Ag—Cu system, symbol 61 represents a solder film and symbol 7 represents a thermosetting resin such as an epoxy resin. The portions having the same functions as in the drawings described above are identified with the same symbols.

In the sixth embodiment, the external terminals 21 provided on the bottom surface of the crystal unit section 2 and the crystal connection terminals 31 provided on the terminal formation surface of the IC chip unit 3 are joined with the high temperature solder 6. As the high temperature solder 6, for example, a tin (Sn)—silver (Ag)—copper (Cu) system can be used, and alternatively, the connection is performed with a known high temperature solder. The high temperature solder is a solder that has a melting point of 183° C. or more, and is applied to a device used in a high temperature environment, in a case where high temperature thermal processing is performed in a manufacturing process or the like.

With respect to the high temperature solder 6, the grained solder is mixed with a flux, and is arranged on the crystal connection terminals 31 with a mask printing technology or the like. Then, the external terminals 21 of the crystal unit section 2 are overlaid on the crystal connection terminals 31, the high temperature solder 6 arranged on the crystal connection terminals 31 is melted and joining is performed between the external terminals 21 and the crystal connection terminals 31 with the solder film 61.

After the external terminals 21 and the crystal connection terminals 31 are joined together, the gap between the bottom surface of the insulation container of the crystal unit section 2 and the formation surface of the crystal connection terminals of the IC chip unit 3 is filled with a joining agent of the thermosetting resin 7. As this thermosetting resin, an epoxy resin is preferably used, however, another thermosetting resin having similar characteristics may be used.

Likewise, in the present embodiment, since all the IC electrode terminals 32 including the crystal connection terminals 31 of the IC chip unit 3 are within the gap filled with the adhesive (thermosetting resin) 7, the increase in the thickness by the joining of the crystal unit section 2 and the IC chip unit 3 is substantially equal to the thickness of the solder film 61, which joins the external terminals 21 of the crystal unit section 2 and the crystal connection terminals 31 of the IC chip unit 3. Hence, the mounting occupation area (the projected area at the time of mounting) is equal to one of the crystal unit section 2 and the IC chip unit 3, which is larger, and a low profile is realized without any increase in the mounting occupation area. Likewise, in the present embodiment, the crystal unit section 2 and the IC chip unit 3 have the same projected area.

[Seventh Embodiment]

FIGS. 9A-9C are diagrams illustrating a seventh embodiment of the surface mount device-type low-profile oscillator disclosed here. The seventh embodiment differs from the other embodiments described above in the structure of the joint of the crystal unit section 2 and the IC chip unit 3. FIG. 9A is an (a-1) bottom view, an (a-2) short-side side view and an (a-3) long-side side view of the crystal unit section. FIG. 9B is a (b-1) top view, a (b-2) short-side side view, a (b-3) long-side side view and a (b-4) bottom view of the IC chip unit. FIG. 9C is a sectional view showing a state where the crystal unit section 2 and the IC chip unit 3 are joined together. In FIGS. 9A-9C, symbol 8 represents a stud bump and symbol 81 represents a gold-gold joining film. The portions having the same functions as in the drawings described above are identified with the same symbols.

In the seventh embodiment, the joining is performed by gold-gold FCB connection between the gold-plated pads of the external terminals 21 provided on the bottom surface of the hermetically sealed insulation container of the crystal unit section 2 and the gold-wire stud bumps 8 formed on the gold plating provided on the formation surface of the crystal connection terminals 31 of the IC chip unit 3.

After the external terminals 21 of the crystal unit section 2 and the crystal connection terminals 31 of the IC chip unit are joined together, the gap between the bottom surface of the insulation container of the crystal unit section 2 and the formation surface of the crystal connection terminals 31 of the IC chip unit 3 are filled with the joining agent made of the thermosetting resin 7. As this thermosetting resin, an epoxy resin is preferably used, as in the embodiments described above, however, another resin having similar characteristics may be used.

Likewise, in the present embodiment, since all the IC electrode terminals 32 including the crystal connection terminals 31 of the IC chip unit 3 are within the gap filled with the thermosetting resin 7, the increase in the thickness by the joining of the crystal unit section 2 and the IC chip unit 3 is substantially equal to the thickness of the gold-gold FCB connection film 81, which joins the external terminals 21 of the crystal unit section 2 and the crystal connection terminals 31 of the IC chip unit 3. Hence, the mounting occupation area (the projected area at the time of mounting: foot print) is equal to one of the crystal unit section 2 and the IC chip unit 3, which is larger, and a low profile is realized without any increase in the mounting occupation area. Likewise, in the present embodiment, the crystal unit section 2 and the IC chip unit 3 have the same projected area.

[Eighth Embodiment]

FIGS. 10A-10C are diagrams illustrating an eighth embodiment of the surface mount device-type low-profile oscillator disclosed here. The eighth embodiment differs from the other embodiments described above in the structure of the joint of the crystal unit section 2 and the IC chip unit 3. FIG. 10A is an (a-1) bottom view, an (a-2) short-side side view and an (a-3) long-side side view of the crystal unit section. FIG. 10B is a (b-1) top view, a (b-2) short-side side view, a (b-3) long-side side view and a (b-4) bottom view of the IC chip unit. FIG. 10C is a sectional view showing a state where the crystal unit section 2 and the IC chip unit 3 are joined together. In FIGS. 10A-10C, symbol 9 represents a solder ball (solder bump) and symbol 91 represents a solder film. The portions having the same functions as in the drawings described above are identified with the same symbols.

In the eight embodiment, the solder balls 9 are arranged on the gold plated pads of the external terminals 21 provided on the bottom surface of the hermetically sealed insulation container of the crystal unit section 2 and the gold plating of the crystal connection terminals 31 provided on the main surface of the IC chip unit 3. Both are joined together with the solder film 91 obtained by melting and curing the solder balls 9. For the arrangement of the solder balls 9, the same method as in the fifth embodiment can be used.

After the external terminals 21 of the crystal unit section 2 and the crystal connection terminals 31 of the IC chip unit 3 are joined together, the gap between the bottom surface of the insulation container of the crystal unit section 2 and the formation surface of the crystal connection terminals 31 of the IC chip unit 3 are filled with the adhesive made of the thermosetting resin 7. As the thermosetting resin, an epoxy resin is preferably used as in the fifth embodiment, however, another resin having similar characteristics may be used.

Likewise, in the present embodiment, since all the IC electrode terminals 32 including the crystal connection terminals 31 of the IC chip unit 3 are within the gap filled with the thermosetting resin 7, the increase in the thickness by the joining of the crystal unit section 2 and the IC chip unit 3 is substantially equal to the thickness of the solder film 91, which joins the external terminals 21 of the crystal unit section 2 and the crystal connection terminals 31 of the IC chip unit 3. Hence, the mounting occupation area (the projected area at the time of mounting) is equal to one of the crystal unit section 2 and the IC chip unit 3, which is larger, and a low profile is realized without any increase in the mounting occupation area. Likewise, in the present embodiment, the crystal unit section 2 and the IC chip unit 3 have the same projected area.

[Ninth Embodiment]

Figure 11A:
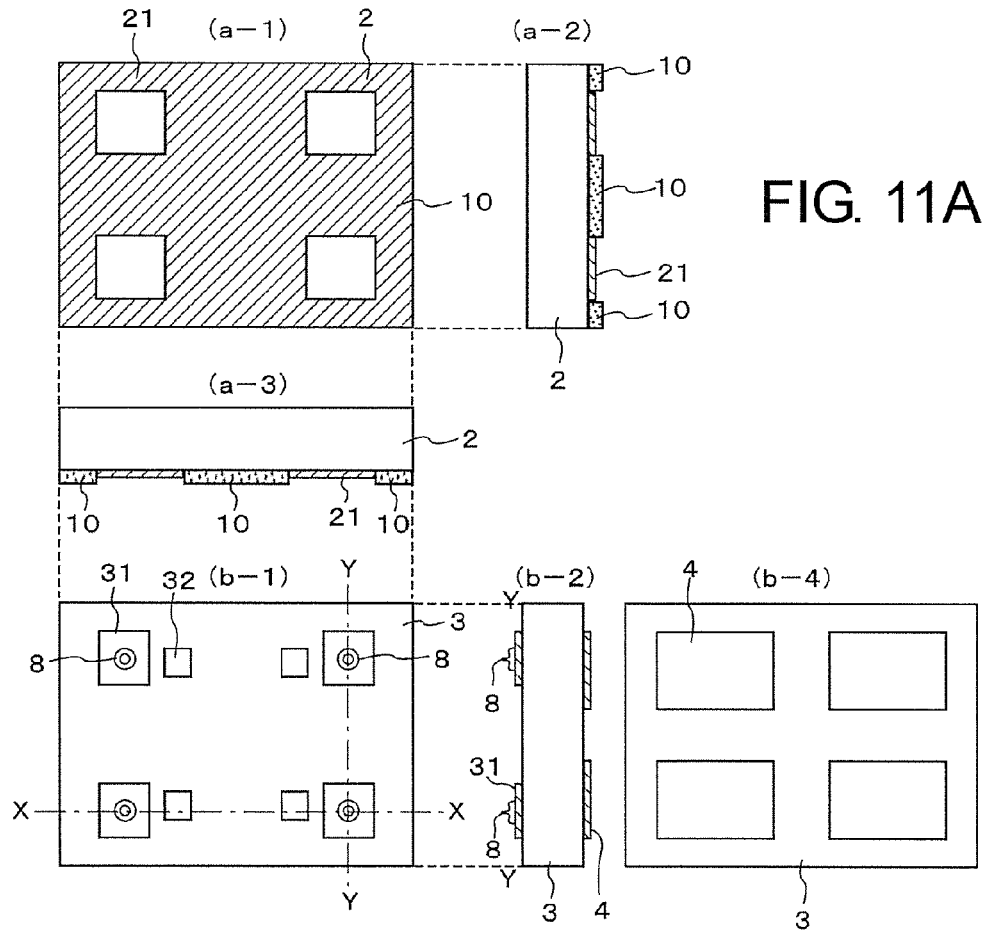
FIGS. 11A-11C are diagrams illustrating an IC chip unit applied to a ninth embodiment of the surface mount device-type low-profile oscillator disclosed herein.
Figure 11B:
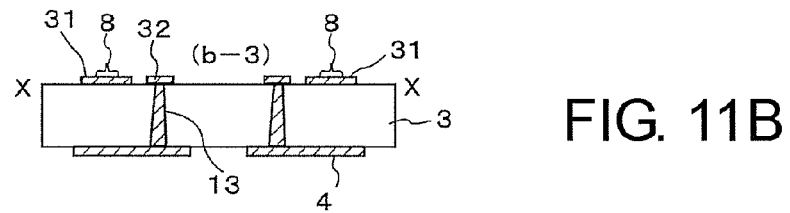
Figure 11C:
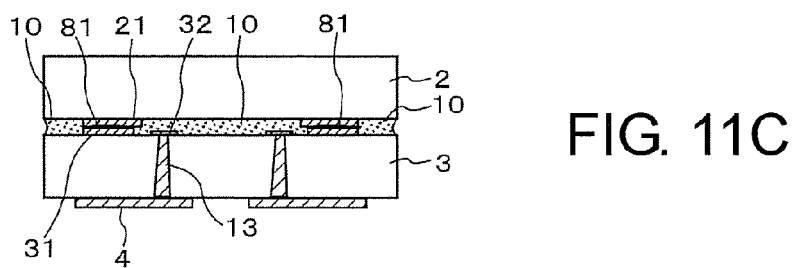

FIGS. 11A-11C are diagrams illustrating a ninth embodiment of the surface mount device-type low-profile oscillator disclosed here. The ninth embodiment is substantially the same as the seventh embodiment described with reference to FIGS. 9A-9C in the structure of the joint of the crystal unit section 2 and the IC chip unit 3 but differs therefrom in the configuration of an insulation film that fills the gap between the joining portions of both. FIG. 11A is an (a-1) bottom view, an (a-2) short-side side view and an (a-3) long-side side view of the crystal unit section. FIG. 11B is a (b-1) top view, a (b-2) short-side side view, a (b-3) long-side side view and a (b-4) bottom view of the IC chip unit. FIG. 11C is a sectional view showing a state where the crystal unit section 2 and the IC chip unit 3 are joined together. In FIGS. 11A-11C, symbol 10 represents the insulation film that an epoxy thermosetting resin is preferably used as and symbol 81 represents a gold-gold joining film. The portions having the same functions as in the drawings described above are identified with the same symbols.

In the ninth embodiment, the joining is performed by gold-gold FCB connection between the gold-plated pads of the external terminals 21 provided on the bottom surface of the insulation container of the crystal unit section 2 and the stud bumps 8 formed on the gold plating of the crystal connection terminals 31 provided on the connection terminal formation surface of the IC chip unit 3. The stud bumps 8 are formed with gold wires.

The insulation film 10 coated to the entire surface except for the upper surface of the external terminals 21 provided on the bottom surface of the insulation container of the crystal unit section 2 is formed to have such a thickness that at the time of joining to the IC chip unit 3, a sufficient amount filling the gap with the crystal connection terminals 31 of the IC chip unit is provided.

At the time of heating processing for melting and joining the external terminals 21 of the crystal unit section 2 and the crystal connection terminals 31 of the IC chip unit 3, the insulation film 10 flows into and fills the gap between both and is cured. As the insulation film 10, an epoxy resin is preferably used, however, another resin having similar characteristics may be used.

In the present embodiment, since all the IC electrode terminals 32 including the crystal connection terminals 31 of the IC chip unit 3 are within the gap filled with the insulation film 10, the increase in the thickness by the joining of the crystal unit section 2 and the IC chip unit 3 is substantially equal to the thickness of the gold-gold FCB connection film of the stud bumps, which joins the external terminals 21 of the crystal unit section 2 and the crystal connection terminals 31 of the IC chip unit 3. Hence, the mounting occupation area (the projected area at the time of mounting) is equal to one of the crystal unit section 2 and the IC chip unit 3, which is larger, and a low profile is realized without any increase in the mounting occupation area. Likewise, in the present embodiment, the crystal unit section 2 and the IC chip unit 3 have the same projected area.

The insulation film 10 of the ninth embodiment can be replaced with the filling thermosetting resin 7 in the embodiments described above.

[Tenth Embodiment]

Figure 12:
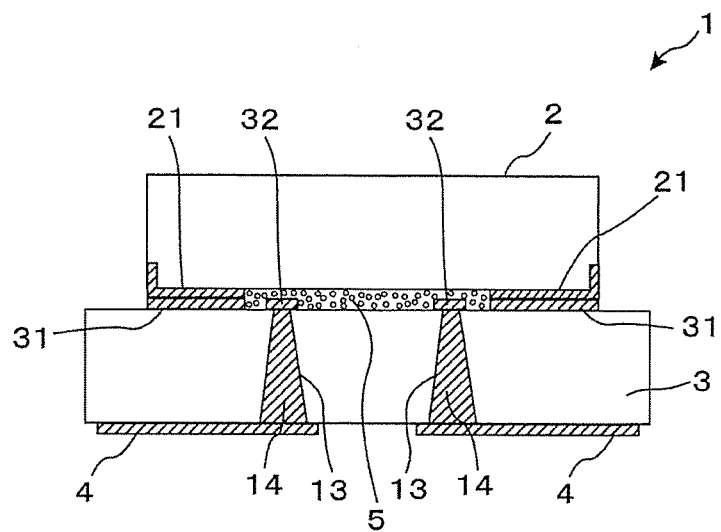
FIG. 12 is a diagram illustrating a tenth embodiment of the surface mount device-type low-profile oscillator disclosed herein.

FIG. 12 is a diagram illustrating a tenth embodiment of the surface mount device-type low-profile oscillator disclosed here. In the tenth embodiment, the structure of the joint of the crystal unit section 2 and the IC chip unit 3 is the same as that in any of the embodiments described above. In the present embodiment, a case where the projected size of the crystal unit section 2 on the mounting surface is smaller than that of the IC chip unit 3 is shown.

In FIG. 12, the crystal connection terminals 31 of the IC chip unit 3 are made to coincide with the positions of the external terminals 21 of the crystal unit section 2 and are provided on the inner side of the IC chip terminal formation surface. However, as in the embodiments described above, the crystal connection terminals 31 may be arranged in positions approaching the edge of the IC terminal formation surface. In this case, it is possible to coat the thermosetting resin to a part of the crystal connection terminals 31 extending out from the crystal unit section 2 and use it as the insulation film. The thermosetting resin is not coated to the part of the crystal connection terminals 31 extending out from the crystal unit section 2, and this part can also be utilized as a crystal inspection terminal.

[Eleventh Embodiment]

Figure 13:
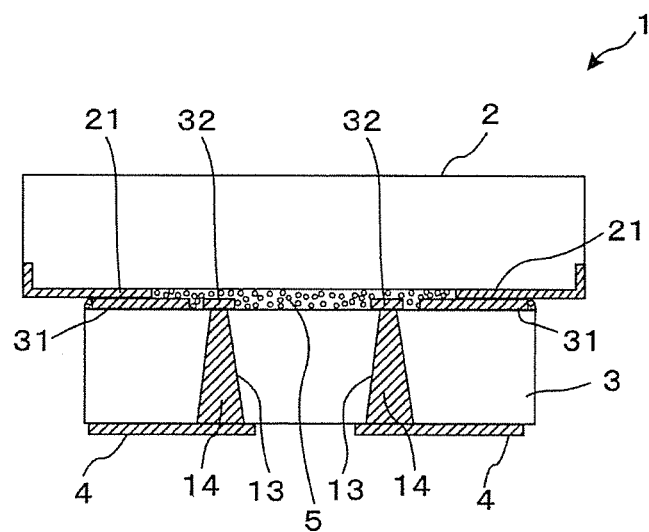
FIG. 13 is a diagram illustrating an eleventh embodiment of the surface mount device-type low-profile oscillator disclosed herein.

FIG. 13 is a diagram illustrating an eleventh embodiment of the surface mount device-type low-profile oscillator disclosed here. In the eleventh embodiment, as in the tenth embodiment described above, the structure of the joint of the crystal unit section 2 and the IC chip unit 3 is the same as that in any of the embodiments described above. In the present embodiment, a case where the projected size of the IC chip unit 3 on the mounting surface is smaller than that of the crystal unit section 2 is shown.

In FIG. 13, the external terminals 21 of the crystal unit section 2 extend out from the crystal connection terminals 31 of the IC chip unit 3. This part can be utilized as the crystal inspection terminal. However, by moving the external terminals 21 inward, the external terminals 21 can be provided in positions opposite to those of the crystal connection terminals 31 of the IC chip unit 3.

[Other Embodiments]

The other embodiments disclosed here are configured substantially similarly except that the crystal unit section differs from the embodiments described above. Specifically, the crystal unit section used in the surface mount device-type low-profile oscillator disclosed here can be configured, as widely known conventionally, by holding the crystal unit as a container, holding the crystal unit in the concave portion of the main body container formed with ceramic and hermetically sealing the concave portion with a metal cover. As the main body container and the cover, a glass material or a silicon material can be used. Instead of the crystal unit only, an oscillator that is obtained by stacking it on the IC chip unit together with an IDT, a MEMS or the like and joining them is also included in this disclosure.

The method for stacking and joining the crystal unit section and the IC chip unit is divided broadly into a method of mounting, in a state of a wafer before being divided into the IC bare chip, the individually divided crystal unit section and thereafter dividing the wafer and a method of stacking the crystal unit section in the same state of the wafer on the wafer of the IC chip unit and dividing them at one time.

FIGS. 14A-14C are schematic diagrams illustrating, in the illustration of the method for mounting the individually divided crystal unit section in the state of the wafer before being divided into the IC bare chip and thereafter stacking and joining the crystal unit section and the IC chip unit dividing the wafer, the former process. In FIGS. 14A-14C, symbol 2 represents an individually divided crystal unit section, and symbol 3A represents an aggregation (wafer) of the bear chips 3 forming a large number of IC circuits.

FIG. 14A shows a state where the crystal unit sections 2 are individually arranged according to the individual IC bear chip portions of the wafer 3A. FIG. 14B shows a state where the crystal unit sections 2 are individually arranged and are joined together as described above. FIG. 14C shows an individual low-profile oscillator 1 obtained by division with a dicing saw according to the individual crystal unit sections. This low-profile oscillator 1 corresponds to that used in the first embodiment described above.

In the latter process described above, in the state of the wafer before dividing the crystal unit section 2 individually, it is placed on the wafer 3A of the IC chip, and both are simultaneously divided after the joining. The process in the case where the other crystal unit sections are used is the same as what has been described above.

In the present invention, since the external terminals of the crystal unit section and the connection terminals of the silicon bare substrate that is the IC chip unit are electrically connected with the anisotropic conductive adhesive (i.e. solder particle containing thermosetting resin), the high temperature solder, the gold-gold connection and the like, and both are joined together mechanically securely, the height (profile) dimension of stacking is only slightly increased. The anisotropic conductive adhesive is not limited to the solder particle containing thermosetting resin, and an adhesive obtained by mixing the metal particles of gold, cupper or the like with the thermosetting resin can be used. Since the connection is made with the electrode columns provided in the via holes penetrating, in the direction of thickness of the bare chip, the IC electrode terminal which is present in the integrated circuit portion of the silicon substrate of the IC chip unit, the IC electrode terminal of the integrated circuit is prevented from being extended over the side wall of the silicon substrate, it is not necessary to connect it to the mounting terminal and the mounting occupation area of the IC chip unit is prevented from being increased.

As described above, in the present invention, it is possible to provide a surface mount device-type low-profile oscillator that has a low profile, a low mounting occupation area and a high reliability.

The present invention is not limited to the low-profile crystal oscillator that has been described in the embodiments discussed above but can be applied to other small electronic components for surface mounting, using a piezoelectric component or a component made by MEMS of a similar structure.

What is claimed is:

1. A surface mount device-type low-profile oscillator in which a crystal unit section and an IC chip unit are integrally installed, wherein
    the crystal unit section hermetically seals a crystal unit therein, and includes, on an external surface, an insulation container provided with an external terminal for acquiring an oscillation output of the crystal unit,
    the IC chip unit is a bare chip, and includes, on a surface of the IC chip unit facing to the external terminal provided in the crystal unit section, an integrated circuit portion that forms an oscillator circuit together with the crystal unit and a crystal unit connection terminal connected to the external terminal of the crystal unit section; and
    the external terminal between a formation surface of the external terminal provided in the insulation container of the crystal unit section and the surface of the IC chip unit facing to the external terminal and a part of the surface of the IC chip unit facing to the crystal unit connection terminal are connected through the crystal unit connection terminal, and
    an area formed between the external terminal and a part of the surface of the IC chip unit not facing to the crystal unit connection terminal is directly adhered with an adhesive.

2. The surface mount device-type low-profile oscillator according to claim 1, wherein
    an anisotropic conductive adhesive formed of a solder particle containing thermosetting resin is interposed in an area formed between the formation surface of the external terminal provided in the insulation container of the crystal unit section and the one surface of the IC chip unit, and
    the external terminal and the part of the surface of the IC chip unit facing to the crystal unit connection terminal are directly joined by melting and curing of the solder particles, and the external terminal and the part of the surface of the IC chip unit not facing to the crystal unit connection terminal are directly adhered by melting and curing of the thermosetting resin.

3. The surface mount device-type low-profile oscillator according to claim 1, wherein
    the external terminal of the crystal unit section and the part of the surface of the IC chip unit facing to the crystal unit connection terminal of the IC chip unit are directly joined by melting and curing of a high temperature solder, and the external terminal and the part of the surface of the IC chip unit not facing to the crystal unit connection terminal are directly adhered by melting and curing of the thermosetting resin.

4. The surface mount device-type low-profile oscillator according to claim 1, wherein
    a gold plated pad is provided on the external terminal provided in the insulation container of the crystal unit section, a gold stud bump on gold plating is provided in the crystal unit connection terminal of the IC chip unit, the external terminal and the part of the surface of the IC chip unit facing to the crystal unit connection terminal are joined by gold-gold flip-chip bonding (FCB) comprising the gold plated pad of the external terminal and the gold stud bump, and the external terminal and the part of the surface of the IC chip unit not facing to the crystal unit connection terminal are directly adhered by melting and curing of the thermosetting resin.

5. The surface mount device-type low-profile oscillator according to claim 1, wherein
    a gold plated pad is provided on the external terminal provided in the insulation container of the crystal unit section, a solder bump obtained by placing solder on gold plating is provided in the crystal unit connection terminal of the IC chip unit, the external terminal and the part of the surface of the IC chip unit facing to the crystal unit connection terminal are joined by the gold plated pad of the external terminal and the solder bump of the crystal unit connection terminal and the external terminal and the part of the surface of the IC chip unit not facing to the crystal unit connection terminal are directly adhered by melting and curing of the thermosetting resin.

6. The surface mount device-type low-profile oscillator according to claim 1, wherein
    the insulation container of the crystal unit section is comprised of a bottom plate, a lid plate and a crystal unit formation plate sandwiched between the bottom plate and the lid plate after formation of the crystal unit, and
    the external terminal is provided on a bottom surface that is an opposite surface of the bottom plate to the crystal unit formation plate.

7. The surface mount device-type low-profile oscillator according to claim 6, wherein
    the bottom plate, the lid plate and the crystal unit formation plate of the insulation container are comprised of a blank, and the crystal unit formed on the crystal unit formation plate is a reverse mesa type obtained by processing the blank.

8. The surface mount device-type low-profile oscillator according to claim 1, wherein
    the crystal unit section is comprised of the insulation container of ceramic, the crystal unit held within a concave portion provided in the insulation container and a plate-shaped metallic lid plate that hermetically seals the concave portion, and the external terminal is provided on a bottom surface that is an opposite surface of the insulation container to the metallic cover.

9. The surface mount device-type low-profile oscillator according to claim 1, wherein
    the crystal unit section is comprised of a bottom plate of glass, a crystal unit formation plate obtained by processing a crystal unit part to form a reverse mesa type and a glass lid plate that is a glass plate which seals the crystal unit formed on the crystal unit formation plate together with the bottom plate, and the external terminal is provided on a bottom surface that is an opposite surface of the bottom plate to the glass lid plate.

10. The surface mount device-type low-profile oscillator according to claim 1, wherein the crystal unit section is comprised of a bottom plate of silicon, a crystal unit formation plate obtained by processing a crystal unit part to form a reverse mesa type and a silicon lid plate that is a silicon plate which seals the crystal unit formed on the crystal unit formation plate together with the bottom plate, and the external terminal is provided on a bottom surface that is an opposite surface of the insulation body container to the silicon lid plate.

11. The surface mount device-type low-profile oscillator according to claim 1, wherein an integrated circuit portion forming the oscillator circuit of the IC chip unit includes a temperature compensation circuit, a temperature control circuit or a constant temperature mechanism.

12. The surface mount device-type low-profile oscillator according to claim 1, wherein an amount of a thermosetting resin filled between the crystal unit section and the IC chip unit is enough to fill a gap formed the IC chip unit and the crystal unit section at a time of joining the IC chip unit to the crystal unit section.

* * * * *